United States Patent [19]

Teng

[11] 4,431,459
[45] Feb. 14, 1984

[54] FABRICATION OF MOSFETS BY LASER ANNEALING THROUGH ANTI-REFLECTIVE COATING

[75] Inventor: Tzu-Chan Teng, San Jose, Calif.

[73] Assignee: National Semiconductor Corporation, Santa Clara, Calif.

[21] Appl. No.: 284,298

[22] Filed: Jul. 17, 1981

[51] Int. Cl.³ .................. H01L 21/263; H01L 21/265
[52] U.S. Cl. .................................... 148/1.5; 29/576 B; 148/187; 427/53.1; 357/91
[58] Field of Search .................. 148/1.5, 187; 136/256; 427/53.1; 357/91; 29/576 B

[56] References Cited

U.S. PATENT DOCUMENTS

| | | | |
|---|---|---|---|
| 4,086,102 | 4/1978 | King | 148/1.5 |
| 4,131,488 | 12/1978 | Lesk et al. | 148/1.5 |
| 4,229,232 | 10/1980 | Kirkpatrick | 148/1.5 |
| 4,379,729 | 4/1983 | Hansen et al. | 148/1.5 |

OTHER PUBLICATIONS

Tamura et al., J. Appl. Phys. 50 (May 1979), 3783–3784.
Teng et al., Electrochem. Soc. Meeting, Abs. #430, Hollywood, Fla., Oct. 1980, pp. 1086–1087.
Gat et al., Appl. Phys. Letts., 32 (1978), 142; 33 (1978), 775.
Teng et al., Electronics Letts., (1980), p. 477.
Koyangi et al., Appl. Phys. Letts., 35 (1979) 621.
Lysenko et al., Sov. Phys. Semicond., 11 (1977) 1327.
Joshi et al., IBM-TDB, 11 (1968) 104.
Petersen, IBM-TDB, 22 (1980) 5053.
Kamins et al., IEEE Trans. Electron Devices, ED-27 (Jan. 1980) 290.

*Primary Examiner*—Upendra Roy
*Attorney, Agent, or Firm*—Gail W. Woodward; Paul J. Winters; Michael J. Pollock

[57] ABSTRACT

A method of annealing an ion implanted semiconductor device using an antireflective dielectric coating on the device for maximizing the coupling of photon radiation into the device. An IGFET device made in accordance with the method, is shown.

13 Claims, 1 Drawing Figure

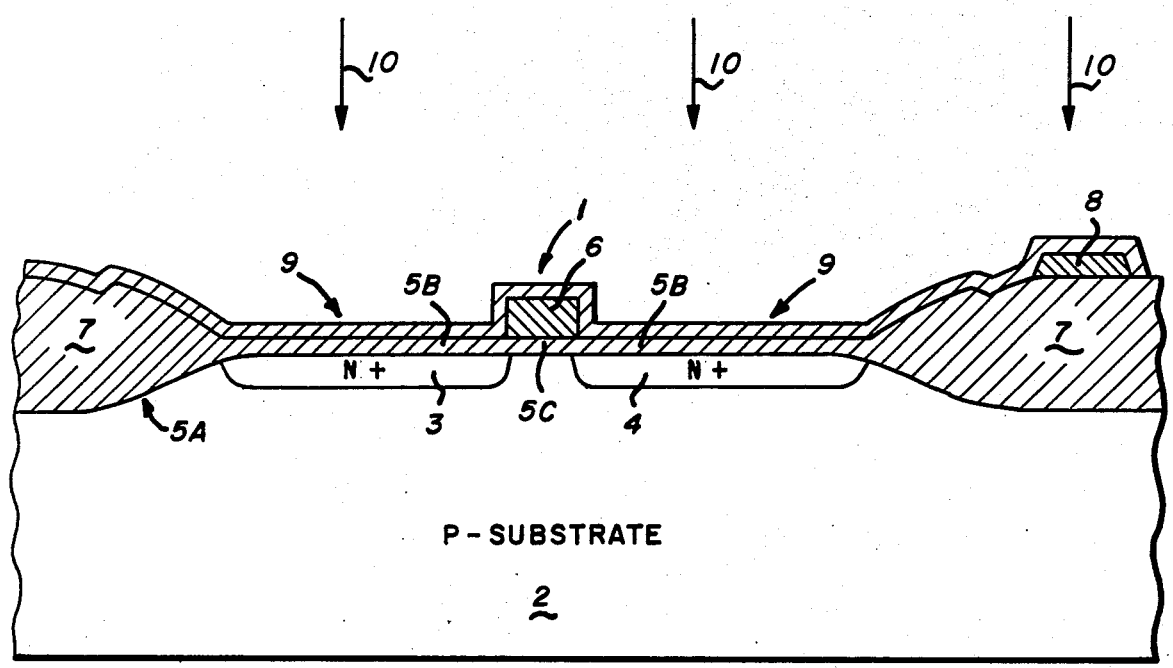

FABRICATION OF MOSFETS BY LASER ANNEALING THROUGH ANTI-REFLECTIVE COATING

BACKGROUND OF THE INVENTION

The present invention relates to a method of fabricating a semiconductor device in general and in particular to a method of using photon radiation in conjunction with an anti-reflective coating for annealing an ion implanted semiconductor device and products and apparatus made therefrom.

In recent years it has been demonstrated that continuous wave (CW) laser annealing can activate high dose implants in silicon with no deviation from the implanted impurity profile. See, A. Gat and J. F. Gibbons, "A Laser-scanning Apparatus for Annealing of Ion Implantation Damage in Semiconductor," Appl. Phys. Let. 32(3), P142, February 1978. It has also been demonstrated that it can also reduce polysilicon sheet resistance. See, A. Gat, L. Gerzberg, J. F. Gibbons, T. J. Magee, J. Peng, J. D. Hong, "CW Laser Anneal of Polycrystalline Silicon: Crystalline Structure, Electrical Properties," Appl. Phys. Lett. 33(8), p775, October 1978. Because of these features, CW laser annealing is an attractive processing technology for fabricating VLSI circuits. Heretofore, however, these potential advantages have not been demonstrated by improvement in the dynamic behavior of a circuit.

In the past the primary difficulty with the CW laser annealing process was that regions covered with $SiO_2$ layers absorbed more energy than the implanted source and drain areas. This was due to the interference affect of the coherent laser light. This caused excessive heating in the junction parameter area which induced defects and yielded poor device characteristics. See, A. Gat, et al., Appl. Phys. Lett. 33(8) p775, October 1978, supra, and T. C. Teng, J. D. Merritt, J. Velez, J. Peng, L. Palkuti, "Short-Channel Polysilicon-Gate MOSFET's Fabricated by CW Argon Laser Annealing of Arsenic Implanted Source and Drain," Electronics Letters, 16(12), June, 1980. Among the poor device characteristics obtained due to the excessive heating in the junction parameter area is the relatively high reverse bias voltage leakage current that occurs in the presence of such defects.

SUMMARY OF THE INVENTION

In view of the foregoing, a principal object of the present invention is a method of annealing an ion implanted semiconductor device in which damage due to excessive heating at the periphery of the device is eliminated or reduced to an acceptable level.

Another object of the present invention is a semiconductor device made in accordance with the above described method of the present invention.

Another object of the present invention is a semiconductor apparatus comprising semiconductor devices made in accordance with the above described method of the present invention.

In accordance with the method of the present invention there is provided a semiconductor device having a substrate. In the substrate there is provided a source and a drain region. A coating comprising a compound of the underlying substrate having a predetermined thickness is provided on the substrate by any conventional deposition technique. The thickness of the coating is chosen such that a maximum coupling of photon radiation into the source and drain regions is achieved. By appropriately adjusting the coating thickness both coherent and non-coherent radiation can be used. Using such techniques $n^+ - p$ junction diodes with an acceptably low reverse reverse bias junction leakage and short channel MOSFETS have been successfully fabricated. T. C. Teng, C. Skinner, Y. Shiau, S. DeOrnellas, J. Readdie, J. Peng, "Laser Anneal Process and MOSFETS Using Antireflection Effect of $SiO_2$ Film," Electrochemical Soc. Meeting, Hollywood, FL, October 1980.

In comparison with conventional thermal annealing, laser annealing using an antireflective coating in accordance with the present invention is found to reduce the polysilicon sheet resistance from 20 ohms per square to 12 ohms per square, increase the $n^+$ sheet resistance from 32 ohms per square to 60 ohms per square and reduce the $n^+$ junction depth from 0.33 $\mu m$ to 0.12 $\mu m$.

In a memory device made according to the present invention both address access time and chip select access time was reduced from $40 \pm 2$ nanoseconds to $30 \pm 2$ nanoseconds in comparison with a device made using conventional thermal annealing.

BRIEF DESCRIPTION OF THE DRAWING

Other objects, features and advantages of the present invention will become apparent in the following detailed description of the accompanying drawing comprising a cross section of a device made according to the present invention.

DETAILED DESCRIPTION OF THE INVENTION

Referring to the drawing, there is provided a semiconductor device designated generally as 1, comprising a P-substrate 2. In the substrate 2, there is provided an $n^{30}$ source area 3 and an $n^+$ drain area 4. An oxide layer 5 covers the silicon. The thick oxide 5A is the device field oxide. A thinner portion 5B exists over the source and drain electrodes 3 and 4. The thin oxide 5C also covers the active transistor in the device gate region. Between the source and drain regions 3 and 4 there is provided a polycrystalline silicon gate 6.

At the edges of the source and drain regions 3 and 4 the field oxide layer 5A is made sufficiently thick to provide an isolation region 7. Over the isolation region 7 there is provided a second polycrystalline silicon layer 8. The layer 8 is provided for subsequent use as a control line.

To anneal the source and drain regions 3 and 4, the regions 3 and 4 are irradiated with photons as represented by arrows 10.

Over the layers 3, 4, 6 and 8 there is further provided a layer of oxide having the same composition as the oxide layer 5 for providing an antireflective coating 9. For maximum photo transmission the thickness of the coatings 5 and 9 over the source and drain regions 3 and 4 is approximately ¼ of the wave length of the incident photon radiation or an odd multiple thereof.

In preparing an embodiment of the invention, standard design rules were followed except for the gate length, which was reduced to 2 micrometers. Major process parameters were: 1.2 $\mu m$ isoplanar field oxide, 450 Å gate oxide and a 4500 Å LPCVD polycrystalline silicon $POCL_3$ doped before patterning. After the polysilicon was masked and etched, the major change in the process was the addition of a short oxidation to regrow the oxide over the source and drain and thereby provide an antireflective coating above the source and drain areas 3 and 4 to a value of 550 Å to enhance coupling to an Argon CW laser. (Actually a value of 835 Å would be closer to optimum.)

Source and drain doping was accomplished using a 140 KEV, $5\times10^{15}$ ions/cm$^2$ arsenic implant through the antireflective oxide coating.

At this point, to determine the efficacy of the process one half of the devices made were subjected to a standard thermal cycle CVD oxide deposition, contact masking and oxide reflow. The other half was laser annealed with a commercial CW argon laser system made by Coherent Radiation Labratories, Palo Alto, Calif. (Coherent 5000) with the following parameters: laser power 5.5 watts, beam spot diameter 80 $\mu$m, scan rate 25 cm/sec, line to line step size 50 $\mu$m, and a substrate temperature 500±5° C. CVD oxide was then deposited and the contact opening defined, but, the oxide reflow step was omitted. Both the thermally and laser annealed wafers were then metalized with Pt-Si/-Ti-W/AL, and metal masking and hydrogen alloy/annealing completed the process.

The process parameters of both the laser annealed and thermal annealed cases are listed in Table I. The shallow junctions of the laser annealed devices (0.12 $\mu$m) are attributed to the diffusion free activation of the laser process and the lack of any subsequent high temperature processing. The lower polysilicon sheet resistance is attributed again to the high temperature of the laser process. The effects of the laser process on circuit performance are summarized in Table II.

TABLE I

| Process parameters | L.A. | Control |
|---|---|---|
| Poly Sheet Resistance | 12Ω/□ | 20Ω/□ |
| n+ Sheet Resistance | 60Ω/□ | 32Ω/□ |
| n+ Junction Depth | 0.12 $\mu$m | 0.33 $\mu$m |

TABLE II

| Device Characteristics | L.A. | Control |
|---|---|---|
| Address Access Time(ns) | 30 ± 2 | 40 ± 2 |
| Chip Select Access Time(ns) | 30 ± 2 | 40 ± 2 |
| Active Power Dissipation(mW) | 700 ± 100 | 700 ± 100 |
| Standby Power Dissipation(mW) | 60 ± 10 | 60 ± 10 |

The major contributions of the method which are achieved with no increase in power dissipation in the laser annealed circuits are (i) a reduction of polysilicon sheet resistance which reduces the word line time delay; (ii) a smaller overlap capacitance between the gate electrode and n+ regions 3 and 4 which increases the MOSFET switching speed and (iii) a smaller side wall capacitance due to a shallower junction which reduces time delay of bit lines and signal propagation.

While a preferred embodiment of the invention is described together with a description of a device and apparatus incorporating devices made thereby, it is contemplated that various changes may be made thereto without departing from the spirit and scope of the present invention. For example, the oxide layer 9 may be any transparent dielectric material deposited using conventional thermal deposition techniques, plasma enhanced deposition techniques, chemical vapor deposition techniques and conventional sputtering techniques. The thickness of the antireflective coating 9 may vary so long as it comprises a thickness of approximately $(2n+1)\lambda/4$, where $\lambda$ is the wavelength of the incident photon radiation in the coating material and n is an integer. The radiation may be either coherent or noncoherent. Devices made using the invention may comprise discrete semiconductor devices, integrated circuits, very large semiconductor integrated circuit devices and solar cells. Solar cells may benefit greatly from the present invention in that they require for best operation shallow junctions. For these reasons it is to be understood that the above description is provided only for illustrating and explaining the present invention and that the scope thereof should be determined primarily by reference to the claims hereinafter provided and their equivalents.

What is claimed is:

1. A method of annealing a semiconductor MOSFET device in which ions are implanted in the source and drain regions to create localized pn junctions comprising the steps of:

depositing an antireflective dielectric coating on said MOSFET device; and irradiating said device with photons at a power level below that at which said junctions will be damaged.

2. A method according to claim 1, wherein said step of depositing comprises the step of thermally growing said antireflective dielectric coating on said device.

3. A method according to claim 1, wherein said step of depositing comprises the step of using a chemical vapor deposition technique.

4. A method according to claim 1, wherein said step of depositing comprises the step of using a plasma activated chemical vapor reaction process for depositing said coating on said device.

5. A method according to claim 1, wherein said step of depositing comprises the step of sputtering said coating on said device.

6. A method according to claim 1, wherein said step of depositing comprises the step of depositing a coating having a thickness of approximately $(2n+1)\lambda/4$, where $\lambda$ is the wave length of said photons and n is an integer.

7. A method according to claim 1, wherein said device comprises a substrate and said step of depositing comprises the step of depositing a coating comprising a compound of said substrate.

8. A method according to claim 7, wherein said substrate comprises silicon and said compound comprises silicon dioxide.

9. A method according to claim 7, wherein said substrate comprises silicon and said compound comprises silicon nitride.

10. A method according to claim 1, wherein said step of irradiating comprises the step of irradiating said device with coherent photon radiation.

11. A method according to claim 10, wherein said coherent photon radiation is laser radiation.

12. A method according to claim 11, wherein said laser radiation is argon laser radiation.

13. A method according to claim 12, wherein said argon laser radiation is continuous wave argon laser radiation.

* * * * *